United States Patent
Yabe

(10) Patent No.: US 10,056,865 B2
(45) Date of Patent: Aug. 21, 2018

(54) SEMICONDUCTOR CIRCUIT

(71) Applicant: Toshiba Memory Corporation, Tokyo (JP)

(72) Inventor: Hiroo Yabe, Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/442,687

(22) Filed: Feb. 26, 2017

(65) Prior Publication Data

US 2018/0076776 A1  Mar. 15, 2018

(30) Foreign Application Priority Data

Sep. 15, 2016 (JP) ................. 2016-180968

(51) Int. Cl.
*H03F 3/45* (2006.01)
*H03F 1/30* (2006.01)

(52) U.S. Cl.
CPC .......... *H03F 1/30* (2013.01); *H03F 3/45475* (2013.01); *H03F 2203/45021* (2013.01); *H03F 2203/45026* (2013.01); *H03F 2203/45286* (2013.01)

(58) Field of Classification Search
CPC ........................... H03F 3/45; H03F 2200/447
USPC ................................................. 330/256, 289
See application file for complete search history.

(56) References Cited

U.S. PATENT DOCUMENTS

| 6,707,333 B2 | 3/2004 | Matsumoto et al. |
| 9,134,740 B2 | 9/2015 | Nishikawa et al. |
| 2003/0160649 A1* | 8/2003 | Nakai ............... G05F 1/465 327/540 |

FOREIGN PATENT DOCUMENTS

JP  2000-278053 A  10/2000

* cited by examiner

*Primary Examiner* — Steven J Mottola
(74) *Attorney, Agent, or Firm* — Patterson & Sheridan, LLP

(57) ABSTRACT

A semiconductor circuit includes a differential amplifier having a first positive terminal, a second positive terminal, a first negative terminal, a second negative terminal, and an output terminal. The output voltage is at a level that corresponds to a voltage level obtained by subtracting a voltage of the first negative terminal and the second negative terminal from a voltage sum of the first positive terminal and the second positive terminal. A first diode has a first anode connected to one of the first positive or the first negative terminal. A second diode has a second anode connected to the other of the first negative and first positive terminal. A predetermined reference voltage is applied to the second positive terminal. And a voltage corresponding to the output voltage of the differential amplifier is fed back to the second negative terminal.

20 Claims, 10 Drawing Sheets

SEMICONDUCTOR CIRCUIT

CROSS-REFERENCE TO RELATED APPLICATION

This application is based upon and claims the benefit of priority from Japanese Patent Application No. 2016-180968, filed Sep. 15, 2016, the entire contents of which are incorporated herein by reference.

FIELD

Embodiments described herein relate generally to a semiconductor circuit.

BACKGROUND

A voltage output lacking a temperature dependence characteristic has been proposed. In many of recent semiconductor devices, a resistor in the device has a temperature varying characteristic, and thus current flowing through the resistor may vary with temperature changes even though a voltage applied to the resistor does not vary with temperature changes.

Thus, a voltage signal or a current signal, which is to be input to various circuits, which might themselves have a temperature varying characteristic, may preferably have a temperature varying characteristic which might match the circuits.

DETAILED DESCRIPTION

In general, according to one embodiment, a semiconductor circuit includes a differential amplifier having a first positive input terminal, a second positive input terminal, a first negative input terminal, a second negative input terminal, and an output terminal. The differential amplifier is configured to output a voltage (an output voltage) from the output terminal at a level that corresponds to a voltage level obtained by subtracting a voltage supplied at the first negative input terminal and a voltage supplied at the second negative input terminal from a summed value of a voltage supplied at the first positive input terminal and a voltage supplied at the second positive input terminal. A first diode has a first junction area and a first anode connected to one of the first positive input terminal or the first negative input terminal. A first cathode of the first diode is connected to a ground potential. A second diode has a second junction area and a second anode connected to the other one of the first negative input terminal and the first positive input terminal to which the first diode is not connected. A second cathode of the second diode is connected to the ground potential. An anode voltage of the first diode is applied to the one of the first positive input terminal or the first negative input terminal. An anode voltage of the second diode is applied to the other of the first positive input terminal and the first negative input terminal. A predetermined reference voltage is applied to the second positive input terminal. And a voltage corresponding to the output voltage of the differential amplifier is fed back to the second negative input terminal.

Hereinafter, example embodiments will be described with reference to the drawings.

(First Embodiment)

Figure 1:
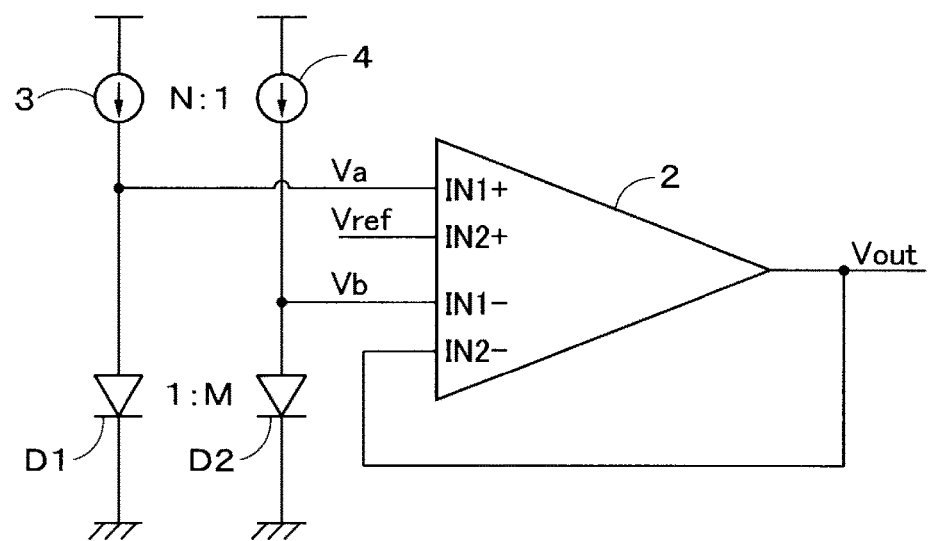
FIG. 1 is a circuit diagram of a semiconductor circuit according to a first embodiment.

FIG. 1 is a circuit diagram of a semiconductor circuit 1a according to a first embodiment. The semiconductor circuit 1a of FIG. 1 includes a first diode D1, a second diode D2, and a four-input differential amplifier 2. The first diode D1, the second diode D2, and the four-input differential amplifier 2 are integrated in one semiconductor chip.

In the first diode D1 and the second diode D2, a ratio of the PN junction area of the first diode D1 and of the PN junction area the second diode D2 is 1:M (M is a real number larger than 0), and a ratio of a current between an anode and a cathode of the first diode D1 and a current between an anode and a cathode of the second diode D2 is N:1 (N is a real number larger than 0). For example, the current from a first current source 3 is supplied to the first diode D1, and the current from a second current source 4 is supplied to the second diode D2. The first diode D1 and the second diode D2 are formed through a semiconductor fabrication process to have the substantially the same device structure although the junction area and the supply current may be different therebetween. As a specific example, the first and second diodes D1 and D2 can be produced by using PNP bipolar transistors.

The four-input differential amplifier 2 includes a first positive-side input terminal IN1+, a second positive-side input terminal IN2+, a first negative-side input terminal IN1−, a second negative-side input terminal IN2−, and an output terminal. The four-input differential amplifier 2 outputs, from the output terminal, a voltage corresponding to a voltage obtained by subtracting a voltage of the first negative-side input terminal IN1− and a voltage of the second negative-side input terminal IN2− from a sum voltage of a voltage of the first positive-side input terminal IN1+ and a voltage of the second positive-side input terminal IN2+. An anode voltage Va of the first diode D1 is input to one of the first positive-side input terminal IN1+ and the first negative-side input terminal IN1−. An anode voltage Vb of the second diode D2 is input to the other of the first positive-side input terminal IN1+ and the first negative-side input terminal IN1−. A predetermined reference voltage is input to the second positive-side input terminal IN2+. An output voltage of the four-input differential amplifier 2 is input to the second negative-side input terminal IN2−. In the example of FIG. 1, the anode voltage of the first diode D1 is input to the first positive-side input terminal IN1+, and the anode voltage of the second diode D2 is input to the first negative-side input terminal IN1−.

In this specification, for simplification, a gain of the four-input differential amplifier 2 is taken to be infinite. However, the actual gain of the four-input differential amplifier 2 may be arbitrarily set to any value in an actual device.

The voltage difference (Va−Vb) between the anode voltage Va of the first diode D1 and the anode voltage Vb of the second diode D2 is expressed by following formula (1) when the Boltzmann constant is referred to as k, electron charges are referred to as q, and a temperature is referred to as t.

[Formula 1]

$$V_a - V_b = \frac{kt}{q}\ln(MN) \tag{1}$$

Formula (1) has a positive temperature characteristic as can be seen in the right side of the equation. The output voltage Vout of the four-input differential amplifier 2 is expressed by following formula (2) when a reference temperature is referred to $T_0$, a temperature difference from the reference temperature $T_0$ is referred to $\Delta t$, an output voltage of the four-input differential amplifier 2 at the reference temperature $T_0$ is referred to as $V_0$, and a proportional constant proportional to the temperature difference $\Delta t$ is referred to as K.

[Formula 2]

$$V_{out} = V_{ref} + \frac{kT_0}{q}\ln(MN) + \frac{k\Delta T}{q}\ln(MN) = V_0 + K\Delta t \tag{2}$$

A proportional coefficient K is expressed by following formula (3).

[Formula 3]

$$K = \frac{k}{q}\ln(MN) \tag{3}$$

As can be seen in formula (2), the output voltage Vout of the four-input differential amplifier 2 changes in proportion to a temperature t, and has a positive temperature characteristic. As can be seen in formula (3), the proportionality constant K can be changed by adjusting at least one of a junction area (size) ratio M and a current ratio N.

In this manner, in the first embodiment, the anode voltage of the first diode D1 is input to the first positive-side input terminal IN1+ of the four-input differential amplifier 2, the anode voltage of the second diode D2 is input to the first negative-side input terminal IN1−, the reference voltage is input to the second positive-side input terminal IN2+, and the output voltage of the four-input differential amplifier 2 is fed back to the second negative-side input terminal IN2−. Accordingly, the output voltage of the four-input differential amplifier 2 has a positive temperature characteristic, and outputs a voltage proportional to a temperature. Therefore, in this first embodiment, the semiconductor circuit 1a which has a positive temperature characteristic and outputs a voltage proportional to a temperature can be provided with a simple circuit configuration.

In a case where a circuit having a temperature characteristic is connected on a post-stage side to the semiconductor circuit 1a according to this first embodiment, the temperature characteristic of the output voltage Vout can be adjusted by adjusting at least one of the above-described M and N in accordance with the temperature characteristic of the post-stage circuit such that the temperature characteristic of the output voltage Vout acts in a countervailing manner to the temperature characteristic of the post-stage circuit.

Specifically, in a case where the semiconductor circuit 1a according to the first embodiment is connected with a post-stage circuit having a negative temperature characteristic on the post-stage side thereof, the semiconductor circuit 1a can be used to offset the temperature characteristic of the post-stage circuit itself.

Figure 2:
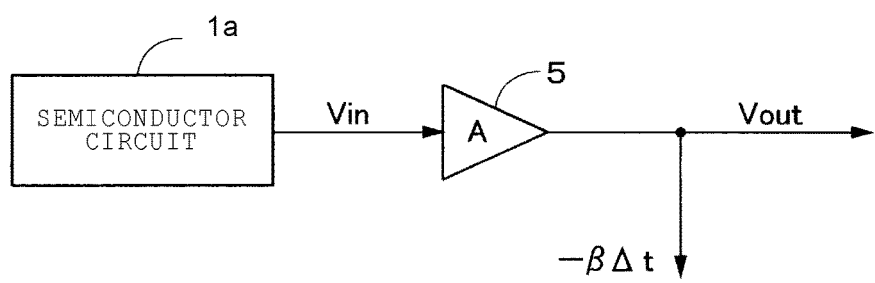
FIG. 2 is a block diagram illustrating an example in which a post-stage circuit having a temperature characteristic of $-\beta \Delta t$ is connected to a post stage of the semiconductor circuit of the first embodiment.

FIG. 2 is a block diagram illustrating an example in which a post-stage circuit 5 having a temperature characteristic of $-\beta\Delta t$ is connected to the post stage of semiconductor circuit 1a of FIG. 1. In this case, an input voltage Vin of the post-stage circuit 5 is expressed by following formula (4) similarly with the above-described formula (2).

[Formula 4]

$$V_{in} = V_{ref} + \frac{kT_0}{q}\ln(MN) + \frac{k\Delta T}{q}\ln(MN) = V_0 + K\Delta t \tag{4}$$

Since the gain is A, and the post-stage circuit 5 has a temperature characteristic of $-\beta\Delta t$, the output voltage Vout of the post-stage circuit 5 is expressed by following formula (5).

[Formula 5]

$$V_{out} = AV_{in} - \beta\Delta t = AV_0 + (AK-\beta)\Delta t \tag{5}$$

When the term $\Delta t$ of formula (5) is zero, and following formula (6) is satisfied, the output voltage Vout of the post-stage circuit 5 does not have a temperature dependence. Formula (6) can be satisfied by adjusting the values of the size ratio M and the current ratio N.

[Formula 6]

$$K = \frac{k}{q}\ln(MN) = \frac{\beta}{A} \tag{6}$$

The output voltage Vout in a case where formula (6) is satisfied is expressed by following formula (7).

[Formula 7]

$$V_{out} = AV_o = A\left(V_{ref} + \frac{kT_o}{q}\ln(MN)\right) \tag{7}$$

The output voltage Vout shown in formula (7) is a voltage not having a temperature dependence, and can be adjusted to a desired voltage value by adjusting a reference voltage Vref.

(Second Embodiment)

In a second embodiment, the output voltage of the four-input differential amplifier 2 has a negative temperature characteristic.

Figure 3:
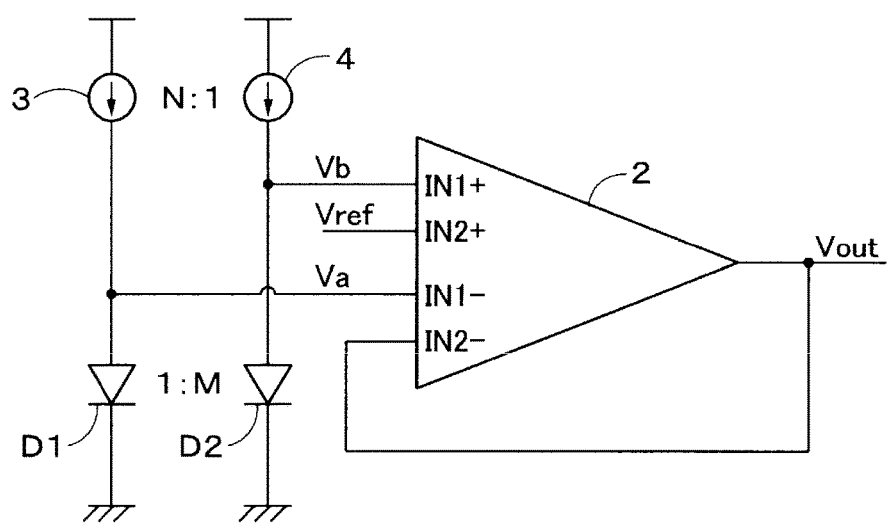
FIG. 3 is a circuit diagram of a semiconductor circuit according to a second embodiment.

FIG. 3 is a circuit diagram of the semiconductor circuit 1b according to the second embodiment. The semiconductor circuit 1b of FIG. 3 is the same as the semiconductor circuit 1a of FIG. 1 excepting that the voltages input to the first positive-side input terminal IN1+ and the second negative-side input terminal IN2− of the four-input differential amplifier 2 are opposite to those of FIG. 1. That is, the anode voltage of the second diode D2 is input to the first positive-side input terminal IN1+ of the four-input differential amplifier 2 of FIG. 3, and the anode voltage of the first diode D1 is input to the first negative-side input terminal IN1−. Similarly with the first embodiment, the first diode D1 and the second diode D2 are sized such that a ratio of a PN junction area of the first diode D1 and a PN junction area of the second diode D2 is 1:M (where M is a real number greater than 0), and a ratio of a current between an anode and a cathode of the first diode D1 and a current between an anode and a cathode of the second diode D2 is N:1 (where N is a real number greater than 0).

The voltage difference (Vb−Va) between the anode voltage Va of the first diode D1 and the anode voltage Vb of the second diode D2 is expressed by following formula (8).

[Formula 8]

$$-(V_a - V_b) = -\frac{kt}{q}\ln(MN) \tag{8}$$

Accordingly, the output voltage Vout of the four-input differential amplifier 2 of FIG. 3 is expressed by following formula (9).

[Formula 9]

$$V_{out} = V_{ref} - \frac{kT_0}{q}\ln(MN) - \frac{k\Delta t}{q}\ln(MN) = V_0 - K\Delta t \tag{9}$$

The proportional coefficient K of formula (9) is expressed by the above-described formula (3). As can be seen in formula (9), the output voltage Vout of the four-input differential amplifier 2 changes in proportion to the temperature t, and has a negative temperature characteristic.

In this manner, in the second embodiment, the anode voltage of the second diode D2 is input to the first positive-side input terminal IN1+ of the four-input differential amplifier 2, the anode voltage of the first diode D1 is input to the first negative-side input terminal IN1−, the reference voltage is input to the second positive-side input terminal IN2+, and the output voltage of the four-input differential amplifier 2 is fed back to the second negative-side input terminal IN2−. Accordingly, the four-input differential amplifier 2 has a negative temperature characteristic, and outputs a voltage proportional to a temperature. Therefore, according to this second embodiment, the semiconductor circuit 1b, which has a negative temperature characteristic and outputs a voltage proportional to a temperature, can be generated using a simple circuit configuration.

In a case where the semiconductor circuit 1b according to the second embodiment is connected with a post-stage circuit having a positive temperature characteristic on the post-stage side thereof, the semiconductor circuit 1b can be used to offset the temperature characteristic of the post-stage circuit 5 itself.

Figure 4:
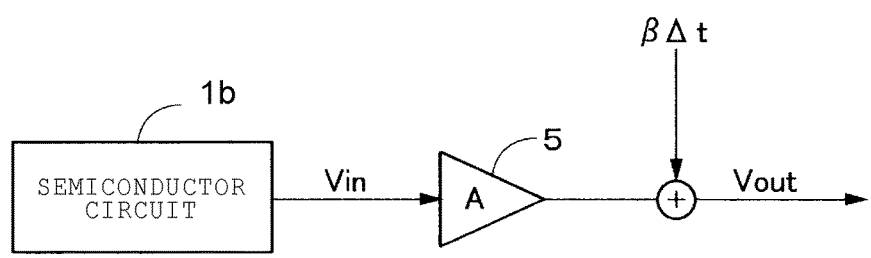
FIG. 4 is a block diagram illustrating an example in which a post-stage circuit having a temperature characteristic of $\beta \Delta t$ is connected to a post stage of the semiconductor circuit of the second embodiment.

FIG. 4 is a block diagram illustrating an example in which the post-stage circuit 5 having a temperature characteristic of βΔt is connected to the post stage of the semiconductor circuit 1b of FIG. 3.

In this case, the input voltage Vin of the post-stage circuit 5 is expressed by following formula (10) similarly with the above-described formula (9).

[Formula 10]

$$V_{in} = V_{ref} - \frac{kT_0}{q}\ln(MN) - \frac{k\Delta t}{q}\ln(MN) = V_0 - K\Delta t \tag{10}$$

Since the gain is A, and the post-stage circuit 5 has a temperature characteristic of βΔt, the output voltage Vout of the post-stage circuit 5 is expressed by following formula (11).

[Formula 11]

$$V_{out} = AV_{in} + \beta\Delta t = AV_0 + (\beta - AK)\Delta t \tag{11}$$

When the above-described formula (6) is satisfied by formula (11), the output voltage Vout of the post-stage circuit 5 does not have a temperature dependence.

In formula (11), the output voltage Vout in a case where formula (6) is satisfied is expressed by following formula (12).

[Formula 12]

$$V_{out} = AV_o = A\left(V_{ref} - \frac{kT_o}{q}\ln(MN)\right) \tag{12}$$

The output voltage Vout shown in formula (12) is a voltage not having a temperature dependence and can be adjusted to a desired voltage value by adjusting the reference voltage Vref.

(Third Embodiment)

In a third embodiment, a current which has a positive temperature characteristic and is proportional to a temperature can be output.

Figure 5:
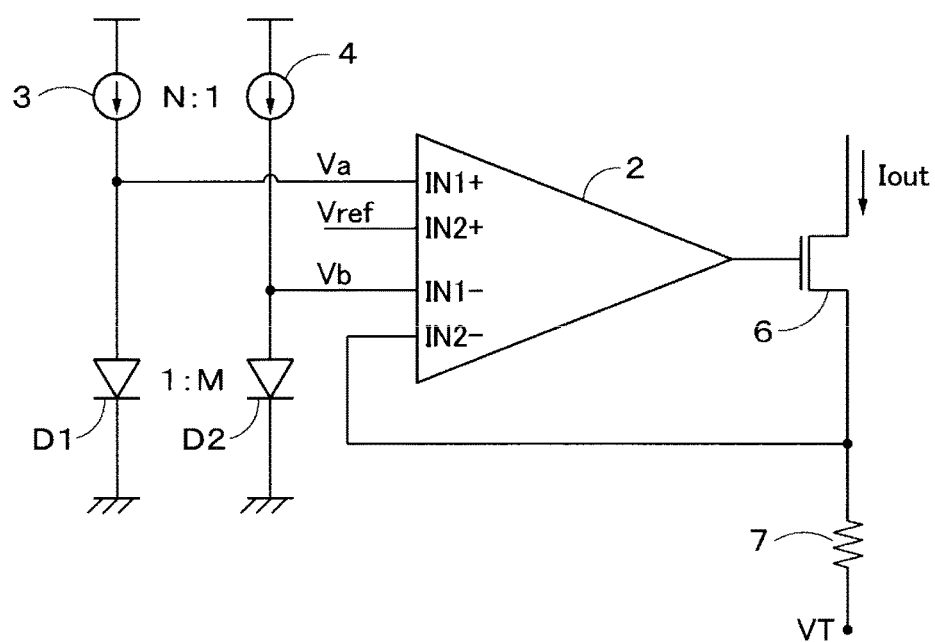
FIG. 5 is a circuit diagram of a semiconductor circuit according to a third embodiment.

FIG. 5 is a circuit diagram of the semiconductor circuit 1c according to the third embodiment. The semiconductor circuit 1c of FIG. 5 is obtained by adding an NMOS transistor 6 and the resistor 7 to the semiconductor circuit 1a of FIG. 1. The gate of the NMOS transistor 6 is connected to the output terminal of the four-input differential amplifier 2. The source of the NMOS transistor 6 is connected to one end of the resistor 7. The other end of the resistor 7 is set to a predetermined voltage VT. The predetermined voltage VT is an arbitrary voltage, and may be, for example, a ground voltage or another voltage. The source voltage of the NMOS transistor 6 is fed back to the second negative-side input terminal IN2− of the four-input differential amplifier 2.

With the above-described feedback configuration, the gate voltage of the NMOS transistor 6 is controlled such that the source voltage of the NMOS transistor 6 becomes the same as Vref+(Va−Vb). Accordingly, when the resistance of the resistor 7 is R, a current Iout flowing through the resistor 7 is expressed by following formula (13).

[Formula 13]

$$I_{out} = \frac{1}{R}\left(V_{ref} - VT + \frac{kT_0}{q}\ln(MN)\right) + \frac{k\Delta t}{qR}\ln(MN) = I_0 + K\Delta t \quad (13)$$

The proportional coefficient K of formula (13) is expressed by following formula (14).

[Formula 14]

$$K = \frac{k}{qR}\ln(MN) \quad (14)$$

The proportional coefficient K is a value corresponding to the resistance R of the resistor 7, the size ratio M of the first diode D1 to the second diode D2, and the current ratio N of the first diode D1 to the second diode D2. As can be seen in formula (13), the current Iout flowing through the resistor 7 has a positive temperature characteristic, and is a current proportional to temperature. The proportional coefficient K can be variably controlled by adjusting at least one of the resistance R, the size ratio M of the first diode D1 to the second diode D2 and the current ratio N of the first diode D1 to the second diode D2.

In a case where the predetermined voltage VT is the ground voltage (0V), formula (13) is simplified like formula (15).

[Formula 15]

$$I_{out} = \frac{1}{R}\left(V_{ref} + \frac{kT_0}{q}\ln(MN)\right) + \frac{k\Delta t}{qR}\ln(MN) = I_0 + K\Delta t \quad (15)$$

Figure 6:
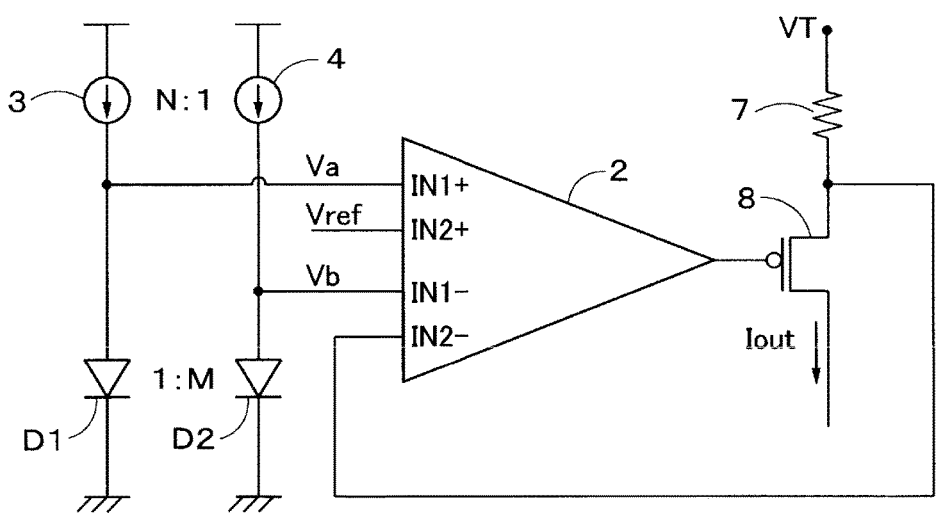
FIG. 6 is a circuit diagram of a semiconductor circuit according to the fourth embodiment.

FIG. 6 is a circuit diagram of the semiconductor circuit 1d according to one modification of FIG. 5. The semiconductor circuit 1d of FIG. 6 is obtained by replacing the NMOS transistor 6 of FIG. 5 with a PMOS transistor 8. One end of the resistor 7 is connected to the source of the PMOS transistor 8, and the arbitrary predetermined voltage VT is supplied to the other end of the resistor 7. The source voltage of the PMOS transistor 8 is fed back to the second negative-side input terminal IN2− of the four-input differential amplifier 2.

The current Iout flowing through the resistor 7 in the semiconductor circuit 1d of FIG. 6 is expressed by following formula (16).

[Formula 16]

$$I_{out} = \frac{1}{R}\left(VT - V_{ref} - \frac{kT_0}{q}\ln(MN)\right) - \frac{k\Delta t}{qR}\ln(MN) = I_0 - K\Delta t \quad (16)$$

In this manner, in the third embodiment, the output voltage of the four-input differential amplifier 2 similar with that of the first embodiment is input to the gate of the NMOS transistor 6 or the PMOS transistor 8, the resistor 7 is connected to the source, and the source voltage is fed back to the second negative-side input terminal IN2− of the four-input differential amplifier 2. Accordingly, the current, which has a positive or negative temperature characteristic and is proportional to a temperature, flows to the resistor 7.

Therefore, the semiconductor circuit 1c or 1d, which outputs a current having a positive or negative temperature characteristic and being proportional to a temperature, can be generated using a simple circuit configuration.

In a case where the semiconductor circuit 1c according to the third embodiment is connected with the post-stage circuit 5 having a positive or negative temperature characteristic on the post-stage side thereof, the semiconductor circuit 1c can be used to offset the temperature characteristic of the post-stage circuit 5 itself.

Figure 7:
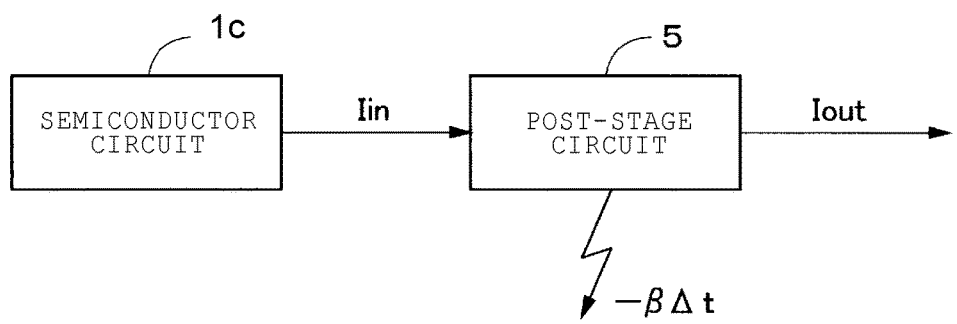
FIG. 7 is a block diagram illustrating an example in which a post-stage circuit having a temperature characteristic of $-\beta \Delta t$ is connected to a post stage of the semiconductor circuit of the third embodiment.

FIG. 7 is a block diagram illustrating an example in which the post-stage circuit 5 having a temperature characteristic of −βΔt, is connected to the post stage of the semiconductor circuit 1c of FIG. 5. In this case, an input current Iin of the post-stage circuit 5 is expressed by following formula (17) similarly with the above-described formula (13).

[Formula 17]

$$I_{in} = \frac{1}{R}\left(V_{ref} - VT + \frac{kT_0}{q}\ln(MN)\right) + \frac{k\Delta t}{qR}\ln(MN) = I_0 + K\Delta t \quad (17)$$

Since the post-stage circuit 5 amplifies the input current Iin by m times but has a temperature characteristic of −βΔt, the output current Iout of the post-stage circuit 5 is expressed by following formula (18).

[Formula 18]

$$I_{out} = mI_{in} - \beta\Delta t = mI_0 + (mK - \beta)\Delta t \quad (18)$$

When the term Δt of formula (18) is zero, and following formula (19) is satisfied, the output current Iout of the post-stage circuit 5 does not have a temperature characteristic. Formula (19) can be satisfied by adjusting the values of the size ratio M and the current ratio N.

[Formula 19]

$$K = \frac{k}{qR}\ln(MN) = \frac{\beta}{m} \quad (19)$$

The output current Iout in a case where formula (19) is satisfied is expressed by following formula (20).

[Formula 20]

$$I_{out} = mI_o = \frac{m}{R}\left(V_{ref} - VT + \frac{kT_o}{q}\ln(MN)\right) \quad (20)$$

The output current Iout shown in formula (20) is a current not having a temperature dependence, and can be adjusted to a desired current value by adjusting the reference voltage Vref and the resistance R of the resistor 7.

In a case where the semiconductor circuit 1d of FIG. 6 is connected with the post-stage circuit 5 having a positive temperature characteristic on the post-stage side thereof, the semiconductor circuit 1d can offset the temperature characteristic of the post-stage circuit 5 in a manner similar to FIG. 7 and FIG. 4.

(Fourth Embodiment)

In a fourth embodiment, the temperature dependence of the current flowing through the resistor 7 is eliminated even if the resistor 7 has a temperature characteristic.

The semiconductor circuit according to the fourth embodiment is realized, for example, as the same circuit configuration as that of FIG. 5 (semiconductor circuit 1c). Thus, the circuit configuration will not be further described.

The current Iout flowing through the resistor 7 in the semiconductor circuit 1c of FIG. 5 is expressed by the above-described formula (13).

The resistance of the resistor 7 at the reference temperature $T_0$ is referred to as Rref, and the temperature characteristic of the resistor 7 is expressed by following formula (21).

[Formula 21]

$$\frac{\partial R}{\partial \Delta t} = R_{ref} x \qquad (21)$$

Rref can be obtained by integrating both sides of formula (21) then substituted into formula (13) to obtain following formula (22).

[Formula 22]

$$I_{out} = \frac{\left(V_{ref} - VT + \frac{kT_o}{q}\ln(MN)\right) + \frac{k\Delta t}{q}\ln(MN)}{R_{ref}(1 + x\Delta t)} \qquad (22)$$

$$= \frac{\left(V_{ref} - VT + \frac{kT_o}{q}\ln(MN)\right)\left(1 + \frac{\frac{k\Delta t}{q}\ln(MN)}{V_{ref} - VT + \frac{kT_o}{q}\ln(MN)}\right)}{R_{ref}(1 + x\Delta t)}$$

In a case where, in formula (22), a value within the parentheses in the denominator is the same as a value within the second parentheses of the numerator, the temperature dependence is eliminated. Here, x in this case is expressed by following formula (23).

[Formula 23]

$$x = \frac{k\ln(MN)}{qV_{ref} - qVT + kT_0\ln(MN)} \qquad (23)$$

In a case where formula (23) is satisfied, the temperature characteristic of the current Iout flowing through the resistor 7 is eliminated even when the resistor 7 has a temperature characteristic. Accordingly, the temperature characteristic of the resistor 7 can be offset by adjusting at least one of the reference voltage Vref, the size ratio M, and the current ratio N such that formula (23) is satisfied, thereby obtaining the current Iout not having a temperature dependence.

In a case where formula (23) is satisfied, the current Iout flowing through the resistor 7 is expressed by formula (24) through formula (22).

[Formula 24]

$$I_{out} = \frac{1}{R_{ref}}\left(V_{ref} - VT + \frac{kT_0}{q}\ln(MN)\right) \qquad (24)$$

On the other hand, the current Iout flowing through the resistor 7 in the semiconductor circuit 1d of FIG. 6 using the PMOS transistor 8 is expressed by formula (16).

The resistance of the resistor 7 at the reference temperature $T_0$ is referred to as Rref, and the temperature characteristic of the resistor 7 is here expressed by the following formula (25).

[Formula 25]

$$\frac{\partial R}{\partial \Delta t} = -R_{ref} x \qquad (25)$$

Rref can be obtained by integrating both sides of formula (25) and then substituted into formula (16) to obtain following formula (26).

[Formula 26]

$$I_{out} = \frac{\left(VT - V_{ref} - \frac{kT_o}{q}\ln(MN)\right) - \frac{k\Delta t}{q}\ln(MN)}{R_{ref}(1 - x\Delta t)} \qquad (26)$$

$$= \frac{\left(VT - V_{ref} - \frac{kT_o}{q}\ln(MN)\right)\left(1 - \frac{\frac{k\Delta t}{q}\ln(MN)}{VT - V_{ref} - \frac{kT_o}{q}\ln(MN)}\right)}{R_{ref}(1 - x\Delta t)}$$

In a case where, in formula (26), a value within the parentheses in the denominator is the same as a value within the second parentheses of the numerator, the temperature dependence is eliminated. Here, x in this case is expressed by following formula (27).

[Formula 27]

$$x = \frac{k\ln(MN)}{qVT - qV_{ref} - kT_0\ln(MN)} \qquad (27)$$

In a case where formula (27) is satisfied, the temperature characteristic (dependency) of the current Iout flowing through the resistor 7 is eliminated even when the resistor 7 itself has a temperature characteristic. Accordingly, the temperature characteristic of the resistor 7 can be offset by adjusting at least one of the reference voltage Vref, the size ratio M, and the current ratio N such that formula (27) is satisfied, thereby obtaining the current Iout not having a temperature dependence.

In a case where formula (27) is satisfied, the current Iout flowing through the resistor 7 is expressed by formula (28) (with relevant terms defined as in formula (26) and formula (27) above).

[Formula 28]

$$I_{out} = \frac{1}{R_{ref}}\left(VT - V_{ref} - \frac{kT_0}{q}\ln(MN)\right) \qquad (28)$$

In this manner, in the fourth embodiment, even in a case where the resistor 7 has a temperature characteristic, the temperature characteristic of the resistor 7 is offset when at least one of the reference voltage Vref, the size ratio M, and the current ratio N is adjusted by using the four-input differential amplifier 2, and thus it is possible to eliminate the temperature dependence of the current flowing through the resistor 7. Accordingly, it is possible to output a constant current regardless of the variation of a temperature.

(Fifth Embodiment)

In a fifth embodiment, a current which has a positive temperature characteristic or a negative temperature characteristic is output by using the four-input differential amplifier 2, which outputs a voltage that has a negative temperature characteristic and is proportional to a temperature.

Figure 8:
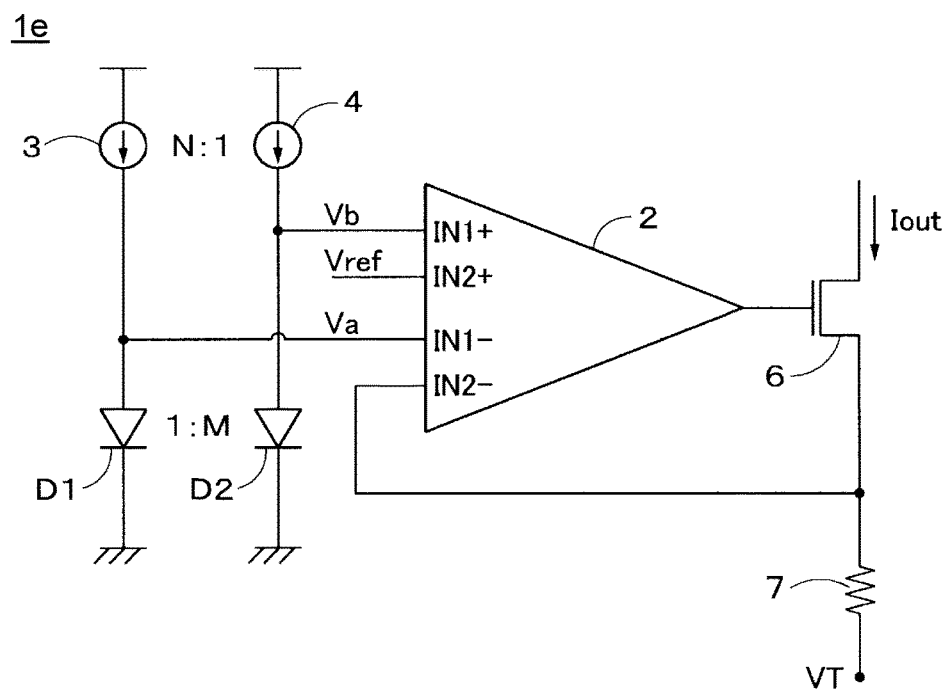
FIG. 8 is a circuit diagram of a semiconductor circuit according to a fifth embodiment.

FIG. 8 is a circuit diagram of the semiconductor circuit 1e according to the fifth embodiment. The semiconductor circuit 1e of FIG. 8 is obtained by adding NMOS transistor 6 and resistor 7 to the semiconductor circuit 1a of FIG. 1. The connection between the NMOS transistor 6 and the resistor 7 is the same as that of FIG. 5. The current Iout flowing through the resistor 7 is expressed by following formula (29).

[Formula 29]

$$I_{out} = \frac{1}{R}\left(V_{ref} - VT - \frac{kT_0}{q}\ln(MN)\right) - \frac{k\Delta t}{qR}\ln(MN) = I_0 - K\Delta t \quad (29)$$

The proportional coefficient K of formula (29) is expressed by the above-described formula (14). As can be seen in formula (29), the current Iout is a current that has a negative temperature coefficient and is proportional to a temperature. The value of the proportional coefficient K can be varied by adjusting at least one of the resistance R, the size ratio M and the supply current ratio N.

Figure 9:
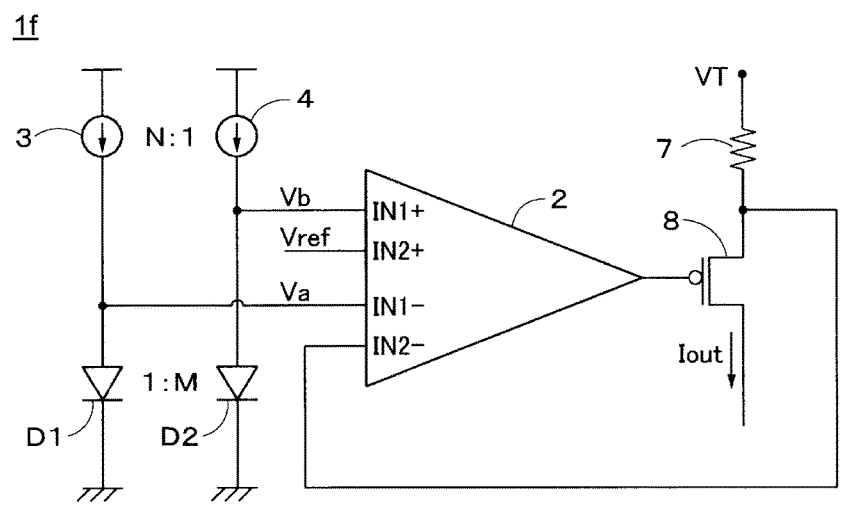
FIG. 9 is a circuit diagram of a semiconductor circuit according to a sixth embodiment.

FIG. 9 is a circuit diagram of the semiconductor circuit 1f according to one modification of FIG. 8. The semiconductor circuit 1f of FIG. 9 is obtained by replacing the NMOS transistor 6 of FIG. 8 with PMOS transistor 8. Here, one end of the resistor 7 is connected to the source of the PMOS transistor 8, and the predetermined arbitrary voltage VT is supplied to the other end of the resistor 7. The source voltage of the PMOS transistor 8 is fed back to the second negative-side input terminal IN2− of the four-input differential amplifier 2.

The current Iout flowing through the resistor 7 in the semiconductor circuit 1f of FIG. 9 is expressed by following formula (30).

[Formula 30]

$$I_{out} = \frac{1}{R}\left(VT - V_{ref} + \frac{kT_0}{q}\ln(MN)\right) + \frac{k\Delta t}{qR}\ln(MN) = I_0 + K\Delta t \quad (30)$$

In this manner, in the fifth embodiment, the output voltage of the four-input differential amplifier 2 having a negative temperature characteristic, similar to that of the second embodiment, is input to the gate of the NMOS transistor 6 or the PMOS transistor 8, the resistor 7 is connected between the source and the predetermined voltage VT, and the source voltage is fed back to the second negative-side input terminal IN2− of the four-input differential amplifier 2. Accordingly, a current that has a negative or positive temperature characteristic and is proportional to a temperature flows through the resistor 7. Therefore, the semiconductor circuit 1e or 1f, which outputs a current having a negative or positive temperature characteristic and is proportional to a temperature, can be generated using a simple circuit configuration.

In a case where the semiconductor circuit 1c according to the third embodiment is connected with a post-stage circuit 5 having a negative or positive temperature characteristic, the semiconductor circuit 1c can be used to offset the temperature characteristic of the post-stage circuit 5 itself.

Figure 10:
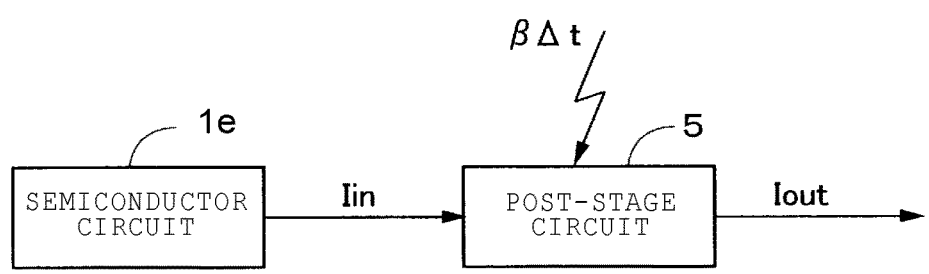
FIG. 10 is a block diagram illustrating an example in which a post-stage circuit having a temperature characteristic of $\beta \Delta t$ is connected to a post stage of the semiconductor circuit of the fifth embodiment.

FIG. 10 is a block diagram illustrating an example in which the post-stage circuit 5 having a temperature characteristic of β∆t is connected to the post stage of the semiconductor circuit 1e of FIG. 8. In this case, the input current Iin of the post-stage circuit 5 is expressed by following formula (31) similarly with the above-described formula (28).

[Formula 31]

$$I_{in} = \frac{1}{R}\left(V_{ref} - VT - \frac{kT_0}{q}\ln(MN)\right) - \frac{k\Delta t}{qR}\ln(MN) = I_0 - K\Delta t \quad (31)$$

Since the post-stage circuit 5 amplifies the input current Iin by m times but has a temperature characteristic of β∆t, the output current Iout of the post-stage circuit 5 is expressed by following formula (32).

[Formula 32]

$$I_{out} = mI_{in} + \beta\Delta t = mI_0 + (\beta - mK)\Delta t \quad (32)$$

When the term ∆t of formula (32) is zero, and above-described formula (19) is satisfied, the output current Iout of the post-stage circuit 5 does not have a temperature characteristic.

The output current Iout, in a case where formula (19) is satisfied, is expressed by following formula (33).

[Formula 33]

$$I_{out} = mI_o = \frac{m}{R}\left(V_{ref} - \frac{kT_o}{q}\ln(MN)\right) \quad (33)$$

The output current Iout shown in formula (33) does not have a temperature dependence, and can be adjusted to a desired current level by adjusting the reference voltage Vref and the resistance R of the resistor 7.

While detailed description will not be given, in a case where the semiconductor circuit 1f of FIG. 9 is connected with the post-stage circuit 5 having a negative temperature characteristic, the semiconductor circuit 1f can offset the temperature characteristic of the post-stage circuit 5.

(Sixth Embodiment)

In a sixth embodiment, similar to the fourth embodiment, the temperature dependence of the current flowing through the resistor 7 can be eliminated even when the resistor 7 has a temperature characteristic.

The sixth embodiment is realized, for example, as the same circuit configuration as depicted in FIG. 8 or 9. Thus, the circuit configuration will not be additionally described.

In a case where the output voltage Vout of the four-input differential amplifier 2 of FIG. 8 has a negative temperature characteristic, as shown in formula (9), the resistance of the resistor 7 at the reference temperature $T_0$ is referred to as Rref, and the temperature characteristic of the resistor 7 is expressed by following formula (34).

[Formula 34]

$$\frac{\partial R}{\partial \Delta t} = -R_{ref} x \quad (34)$$

Rref can be obtained by integrating both sides of formula (34) and is then substituted into formula (29) to obtain following formula (35).

[Formula 35]

$$I_{out} = \frac{\left(VT - V_{ref} - \frac{kT_o}{q}\ln(MN)\right) - \frac{k\Delta t}{q}\ln(MN)}{R_{ref}(1 - x\Delta t)}$$

$$= \frac{\left(VT - V_{ref} - \frac{kT_o}{q}\ln(MN)\right)\left(1 - \frac{\frac{k\Delta t}{q}\ln(MN)}{V_{ref} - VT - \frac{kT_o}{q}\ln(MN)}\right)}{R_{ref}(1 - x\Delta t)} \quad (35)$$

In a case where, a value within the parentheses, in formula (35), in the denominator is the same as a value within the second parentheses of the numerator, the temperature dependence is eliminated. Here, x in this case is expressed by following formula (36).

[Formula 36]

$$x = \frac{k\ln(MN)}{qV_{ref} - qVT - kT_0\ln(MN)} \quad (36)$$

In a case where formula (36) is satisfied, the temperature characteristic of the current Iout flowing through the resistor 7 is eliminated even when the resistor 7 has a temperature characteristic. Accordingly, the temperature characteristic of the resistor 7 can be offset by adjusting at least one of the reference voltage Vref, the size ratio M, and the current ratio N such that formula (36) is satisfied, thereby a current Iout not having a temperature dependence can be provided.

In a case where formula (36) is satisfied, the current Iout flowing through the resistor 7 is expressed by formula (37) (with relevant terms as defined in formulas (35) and (36).

[Formula 37]

$$I_{out} = \frac{1}{R_{ref}}\left(V_{ref} - VT - \frac{kT_0}{q}\ln(MN)\right) \quad (37)$$

On the other hand, the current Iout flowing through the resistor 7 in the semiconductor circuit 1f of FIG. 9 is expressed by formula (30).

The resistance of the resistor 7 at the reference temperature $T_0$ is referred to as Rref, and the temperature characteristic of the resistor 7 is expressed by following formula (38).

[Formula 38]

$$\frac{\partial R}{\partial \Delta t} = R_{ref} x \quad (38)$$

Rref obtained by integrating both sides of formula (38) and can then be substituted into formula (30) to obtain following formula (39).

[Formula 39]

$$I_{out} = \frac{\left(VT - V_{ref} + \frac{kT_o}{q}\ln(MN)\right) + \frac{k\Delta t}{q}\ln(MN)}{R_{ref}(1 + x\Delta t)} \quad (39)$$

$$= \frac{\left(VT - V_{ref} + \frac{kT_o}{q}\ln(MN)\right)\left(1 + \frac{\frac{k\Delta t}{q}\ln(MN)}{VT - V_{ref} + \frac{kT_o}{q}\ln(MN)}\right)}{R_{ref}(1 + x\Delta t)}$$

In a case where, a value within the parentheses in the denominator of formula (39) is the same as a value within the second parentheses of the numerator, the temperature dependence is eliminated. Here, x in this case is expressed by following formula (40).

[Formula 40]

$$x = \frac{k\ln(MN)}{qVT - qV_{ref} + kT_0\ln(MN)} \quad (40)$$

In a case where formula (40) is satisfied, the temperature characteristic of the current Iout flowing through the resistor 7 is eliminated even when the resistor 7 itself has a temperature characteristic. Accordingly, the temperature characteristic of the resistor 7 can be offset by adjusting at least one of the reference voltage Vref, the size ratio M, and the current ratio N such that formula (40) is satisfied, thereby providing a current Iout not having a temperature dependence.

In a case where formula (40) is satisfied, the current Iout flowing through the resistor 7 is expressed by formula (41) obtained by manipulating formula (39).

[Formula 41]

$$I_{out} = \frac{1}{R_{ref}}\left(VT - V_{ref} + \frac{kT_0}{q}\ln(MN)\right) \quad (41)$$

In this manner, in the sixth embodiment, even in a case where the resistor 7 has a temperature characteristic, the temperature characteristic of the resistor 7 can be offset by using the four-input differential amplifier 2 when at least one of the reference voltage Vref, the size ratio M, and the current ratio N is adjusted, and thus it is possible to eliminate the temperature dependence of the current flowing through the resistor 7. Accordingly, it is possible to output a constant current regardless of variations in temperature.

The semiconductor circuits according to the above-described first to sixth embodiments can be used in various applications. For example, in a case where the post-stage circuit 5 has a certain temperature characteristic, it is desirable that the voltage or the current of the temperature characteristic suitable for the temperature characteristic be applied to the post-stage circuit 5. Therefore, it may be desirable to use a semiconductor circuit according to at least one of the first, second, third, or fifth embodiment. On the other hand, in a case where the resistor 7 has a temperature characteristic and the post-stage circuit does not have a temperature characteristic or the semiconductor circuit of the embodiment provides a final output, it may be desirable to output a voltage or a current not having a temperature dependence. Therefore, it may be desirable to use semiconductor circuits according to the fourth or sixth embodiment.

A specific example of the post-stage circuit 5 having a temperature characteristic is, for example, an oscillation circuit or a charge pump. It is desirable that the reference voltage or the reference current supplied to the oscillation circuit, the charge pump, or the like have the temperature characteristic matched to the temperature characteristic of the oscillation circuit or the charge pump. The reference voltage or the reference current suitable for such applications can be provided by at least one of the above described embodiments.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the present disclosure.

What is claimed is:

1. A semiconductor circuit, comprising:
   a differential amplifier having a first positive input terminal, a second positive input terminal, a first negative input terminal, a second negative input terminal, and an output terminal, the differential amplifier being configured to output an output voltage from the output terminal at a level that corresponds to a voltage level obtained by subtracting a voltage supplied at the first negative input terminal and a voltage supplied at the second negative input terminal from a summed value of a voltage supplied at the first positive input terminal and a voltage supplied at the second positive input terminal;
   a first diode having a first junction area, the first diode having a first anode connected to one of the first positive input terminal or the first negative input terminal, and a first cathode connected to a ground potential; and
   a second diode having a second junction area, the second diode having a second anode connected to the other one of the first negative input terminal and the first positive input terminal to which the first diode is not connected, and a second cathode connected to the ground potential, wherein
   an anode voltage of the first diode is applied to the one of the first positive input terminal or the first negative input terminal,
   an anode voltage of the second diode is applied to the other of the first positive input terminal and the first negative input terminal,
   a predetermined reference voltage is applied to the second positive input terminal, and
   a voltage corresponding to the output voltage of the differential amplifier is fed back to the second negative input terminal.

2. The semiconductor circuit according to claim 1, wherein the first junction area is different than the second junction area.

3. The semiconductor circuit according to claim 2, further comprising:
   a first constant current source connected to the first anode and configured to supply a first current; and
   a second constant current source connected to the second anode and configured to supply a second current.

4. The semiconductor circuit according to claim 3, wherein the first current is at a level that is different from a level of the second current.

5. The semiconductor circuit according to claim 1, further comprising:
   a first constant current source connected to the first anode and configured to supply a first current; and
   a second constant current source connected to the second anode and configured to supply a second current, wherein the first current is at a level that is different from a level of the second current.

6. The semiconductor circuit according to claim 1, wherein the first and second diodes comprise PNP bipolar transistors.

7. The semiconductor circuit according to claim 1, further comprising:
   an output transistor, wherein
   the output voltage of the differential amplifier is supplied to a gate of the output transistor and the voltage corresponding to the output voltage is a source voltage of the output transistor.

8. The semiconductor circuit according to claim 7, wherein the output transistor is a n-channel metal-oxide-semiconductor transistor.

9. The semiconductor circuit according to claim 7, wherein the output transistor is a p-channel metal-oxide-semiconductor transistor.

10. The semiconductor circuit according to claim 1, further comprising a post-stage circuit connected to the output terminal of the differential amplifier such that the post-stage circuit receives one of an input voltage or an input current according to the output voltage of the differential amplifier.

11. The semiconductor circuit according to claim 10, wherein the post-stage circuit has a characteristic temperature dependency and a ratio of the first junction area to the second junction area is such that the output voltage of the differential amplifier has a countervailing characteristic temperature dependency.

12. The semiconductor circuit according to claim 10, further comprising:
   a first constant current source connected to the first anode and configured to supply a first current; and
   a second constant current source connected to the second anode and configured to supply a second current, wherein
   the post-stage circuit has a characteristic temperature dependency, and
   a ratio of the first current to the second current is such that the output voltage of the differential amplifier has a countervailing characteristic temperature dependency.

13. A semiconductor circuit, comprising:
   a differential amplifier having a first positive input terminal, a second positive input terminal, a first negative input terminal, a second negative input terminal, and an output terminal, the differential amplifier being configured to output an output voltage from the output terminal at a level that corresponds to a voltage level obtained by subtracting a voltage supplied at the first negative input terminal and a voltage supplied at the second negative input terminal from a summed value of a voltage supplied at the first positive input terminal and a voltage supplied at the second positive input terminal;

a first diode having a first junction area, the first diode having a first anode connected to the first positive input terminal, and a first cathode connected to a ground potential;

a second diode having a second junction area, the second diode having a second anode connected to the first negative input terminal, and a second cathode connected to the ground potential; and a post-stage circuit connected to the output terminal of the differential amplifier such that the post-stage circuit receives one of an input voltage or an input current according to the output voltage of the differential amplifier, wherein an anode voltage of the first diode is applied to the first positive input terminal, an anode voltage of the second diode is applied to the first negative input terminal, a predetermined reference voltage is applied to the second positive input terminal, and a voltage corresponding to the output voltage of the differential amplifier is fed back to the second negative input terminal.

14. The semiconductor circuit according to claim 13, further comprising:

a first constant current source connected to the first anode and configured to supply a first current; and a second constant current source connected to the second anode and configured to supply a second current, wherein the first current is at a level that is different from a level of the second current.

15. The semiconductor circuit according to claim 14, wherein the post-stage circuit has a characteristic temperature dependency, and at least one of a ratio of the first current to the second current or a ratio of the first junction area to the second junction is such that the output voltage of the differential amplifier has a countervailing characteristic temperature dependency.

16. The semiconductor circuit according to claim 15, further comprising:

an output transistor, wherein the output voltage of the differential amplifier is supplied to a gate of the output transistor and the voltage corresponding to the output voltage is a source voltage of the output transistor.

17. A semiconductor circuit, comprising:

a differential amplifier having a first positive input terminal, a second positive input terminal, a first negative input terminal, a second negative input terminal, and an output terminal, the differential amplifier being configured to output an output voltage from the output terminal at a level that corresponds to a voltage level obtained by subtracting a voltage supplied at the first negative input terminal and a voltage supplied at the second negative input terminal from a summed value of a voltage supplied at the first positive input terminal and a voltage supplied at the second positive input terminal;

a first diode having a first junction area, the first diode having a first anode connected to the first negative input terminal, and a first cathode connected to a ground potential;

a second diode having a second junction area, the second diode having a second anode connected to the first positive input terminal, and a second cathode connected to the ground potential; and a post-stage circuit connected to the output terminal of the differential amplifier such that the post-stage circuit receives one of an input voltage or an input current according to the output voltage of the differential amplifier, wherein an anode voltage of the first diode is applied to the first negative input terminal, an anode voltage of the second diode is applied to the first positive input terminal, a predetermined reference voltage is applied to the second positive input terminal, and a voltage corresponding to the output voltage of the differential amplifier is fed back to the second negative input terminal.

18. The semiconductor circuit according to claim 17, further comprising:

a first constant current source connected to the first anode and configured to supply a first current; and a second constant current source connected to the second anode and configured to supply a second current, wherein the first current is at a level that is different from a level of the second current.

19. The semiconductor circuit according to claim 18, wherein the post-stage circuit has a characteristic temperature dependency, and at least one of a ratio of the first current to the second current or a ratio of the first junction area to the second junction is such that the output voltage of the differential amplifier has a countervailing characteristic temperature dependency.

20. The semiconductor circuit according to claim 19, further comprising:

an output transistor, wherein the output voltage of the differential amplifier is supplied to a gate of the output transistor and the voltage corresponding to the output voltage is a source voltage of the output transistor.

* * * * *